(12) United States Patent
Yamane et al.

(10) Patent No.: US 8,872,601 B2
(45) Date of Patent: Oct. 28, 2014

(54) CIRCUIT MODULE INCLUDING A DUPLEXER MOUNTED ON A CIRCUIT SUBSTRATE HAVING A SPECIFIED SECOND GROUND PATH

(71) Applicant: Murata Manufacturing Co., Ltd., Nagaokakyo (JP)

(72) Inventors: Takashi Yamane, Nagaokakyo (JP); Katsuhiro Ikada, Nagaokakyo (JP); Yasuhiko Hirano, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 164 days.

(21) Appl. No.: 13/654,521

(22) Filed: Oct. 18, 2012

(65) Prior Publication Data
US 2013/0038406 A1    Feb. 14, 2013

Related U.S. Application Data

(63) Continuation of application No. PCT/JP2011/059697, filed on Apr. 20, 2011.

(30) Foreign Application Priority Data

Apr. 28, 2010    (JP) .................................. 2010-102925

(51) Int. Cl.
H03H 7/46    (2006.01)
H03H 9/72    (2006.01)
H04B 1/48    (2006.01)
H04B 1/50    (2006.01)
H03H 9/05    (2006.01)

(52) U.S. Cl.
CPC ............... *H03H 7/463* (2013.01); *H03H 9/725* (2013.01); *H03H 9/0576* (2013.01)

USPC ............. 333/133; 333/129; 333/132; 455/78

(58) Field of Classification Search
CPC ..... H03H 7/463; H03H 9/0576; H03H 9/725; H03H 9/0571; H03H 9/706; H04B 1/48; H04B 1/525
USPC ......... 333/126, 129, 132, 133; 455/78, 82, 83
See application file for complete search history.

(56) References Cited

U.S. PATENT DOCUMENTS

2003/0020562 A1    1/2003    Ikada et al.
2009/0058557 A1*   3/2009    Tsurunari et al. ............. 333/133
(Continued)

FOREIGN PATENT DOCUMENTS

CN    1400736 A    3/2003
CN    101217267 A    7/2008
(Continued)

OTHER PUBLICATIONS

Official Communication issued in International Patent Application No. PCT/JP2011/059697, mailed on Jul. 19, 2011.
(Continued)

*Primary Examiner* — Barbara Summons
(74) *Attorney, Agent, or Firm* — Keating & Bennett, LLP

(57) ABSTRACT

A circuit module includes a duplexer and a circuit substrate. A first signal path connects a first external electrode to a second external electrode. A second signal path connects a third external electrode to a fourth external electrode. A third signal path connects a fifth external electrode to a sixth external electrode. A first ground path connects a seventh external electrode to an eighth external electrode. A second ground path is connected to a ninth external electrode and is capacitively coupled to the second signal path.

20 Claims, 5 Drawing Sheets

(56) References Cited

U.S. PATENT DOCUMENTS

| | | | |
|---|---|---|---|
| 2009/0284328 A1* | 11/2009 | Wiesbauer et al. | 333/175 |
| 2010/0026419 A1 | 2/2010 | Hara et al. | |
| 2010/0150075 A1 | 6/2010 | Inoue et al. | |
| 2010/0319975 A1 | 12/2010 | Tsutsumi et al. | |
| 2011/0095843 A1* | 4/2011 | Murase et al. | 333/126 |
| 2011/0193650 A1* | 8/2011 | Takenoshita et al. | 333/4 |
| 2011/0279177 A1* | 11/2011 | Furutani et al. | 330/1 R |

FOREIGN PATENT DOCUMENTS

| | | |
|---|---|---|
| JP | 63-87955 U | 6/1988 |
| JP | 2001-203601 A | 7/2001 |
| JP | 2006-186907 | 7/2006 |
| JP | 2006-203652 A | 8/2006 |
| JP | 2006-217279 A | 8/2006 |
| JP | 2006-295530 A | 10/2006 |
| JP | 2010-041141 A | 2/2010 |
| JP | 2010-068079 A | 3/2010 |
| WO | WO 2006/118039 A1 * | 11/2006 |
| WO | 2009/025057 A1 | 2/2009 |
| WO | 2009/025106 A1 | 2/2009 |
| WO | 2009/104251 A1 | 8/2009 |

OTHER PUBLICATIONS

Official Communication issued in corresponding Chinese Patent Application No. 201180020678.0, mailed on Jul. 23, 2014.

* cited by examiner

CIRCUIT MODULE INCLUDING A DUPLEXER MOUNTED ON A CIRCUIT SUBSTRATE HAVING A SPECIFIED SECOND GROUND PATH

BACKGROUND OF THE INVENTION

1. Field of the Invention

The present invention relates to circuit module substrates, and more particularly, to circuit modules including a duplexer mounted thereon.

2. Description of the Related Art

Known examples of existing circuit modules include an antenna switch module disclosed in Japanese Unexamined Patent Application Publication No. 2006-295530. In this antenna switch module, a first reception signal and a second reception signal which have been received through an antenna and which are based on different communication systems are separated. The separated first and second reception signals are transmitted within a multilayer dielectric medium.

With the antenna switch module disclosed in Japanese Unexamined Patent Application Publication No. 2006-295530, there is a need for reducing undesirable interference generated between the first and second reception signals.

SUMMARY OF THE INVENTION

Preferred embodiments of the present invention reduce undesirable interference generated among a plurality of types of signals in a circuit module on which a duplexer that separates a plurality of types of signal is mounted.

A circuit module according to a first preferred embodiment of the present invention is a circuit module that includes a duplexer and a circuit substrate on which the duplexer is mounted. The duplexer includes a duplexer main body; first, second and third external electrodes and a plurality of duplexer ground external electrodes provided on the duplexer main body; a first filter that outputs a signal input at the first external electrode to the second external electrode; a second filter that outputs a signal input at the third external electrode to the first external electrode; a ground conductor that is connected to the duplexer ground external electrodes and that is maintained at a ground potential. The circuit substrate includes a substrate main body; fourth, fifth and sixth external electrodes and a plurality of substrate top surface ground external electrodes that are provided on the substrate main body and that are respectively connected to the first, second and third external electrodes and the plurality of the duplexer ground external electrodes; seventh, eighth and ninth external electrodes and a substrate bottom surface ground external electrode provided on the substrate main body; a first signal path that connects the fourth external electrode to the seventh external electrode, a second signal path that connects the fifth external electrode to the eighth external electrode, and a third signal path that connects the sixth external electrode to the ninth external electrode; a first ground path that connects a portion of the plurality of the substrate top surface ground external electrodes to the substrate bottom surface ground external electrode; and a second ground path that is connected to the substrate top surface ground external electrode which is not connected to the substrate bottom surface ground external electrode and that is electromagnetically coupled to the second signal path or the third signal path.

A circuit module according to a second preferred embodiment of the present invention is a circuit module that includes a duplexer and a circuit substrate on which the duplexer is mounted. The duplexer includes a duplexer main body; first, second and third external electrodes and a plurality of duplexer ground external electrodes provided on the duplexer main body; a first filter that outputs a signal input at the first external electrode to the second external electrode; a second filter that outputs a signal input at the third external electrode to the first external electrode; a ground conductor that is connected to the duplexer ground external electrodes and that is maintained at a ground potential. The circuit substrate includes a substrate main body; fourth, fifth and sixth external electrodes and a plurality of substrate top surface ground external electrodes that are provided on the substrate main body and that are respectively connected to the first, second and third external electrodes and the plurality of the duplexer ground external electrodes; seventh, eighth and ninth external electrodes and a substrate bottom surface ground external electrode provided on the substrate main body; a first signal path that connects the fourth external electrode to the seventh external electrode, a second signal path that connects the fifth external electrode to the eighth external electrode, and a third signal path that connects the sixth external electrode to the ninth external electrode; a first ground path that connects a portion of the plurality of the substrate top surface ground external electrodes to the substrate bottom surface ground external electrode; and a second ground path that is connected to the substrate top surface ground external electrode which is not connected to the substrate bottom surface ground external electrode and that is coupled to the second signal path or the third signal path through a phase unit.

According to various preferred embodiments of the present invention, in a circuit module on which a duplexer that separates a plurality of types of signal is mounted, undesirable interference generated among the plurality of types of signal is significantly reduced and prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, circuit modules according to preferred embodiments of the present invention will be described with reference to the drawings.

Figure 1A:
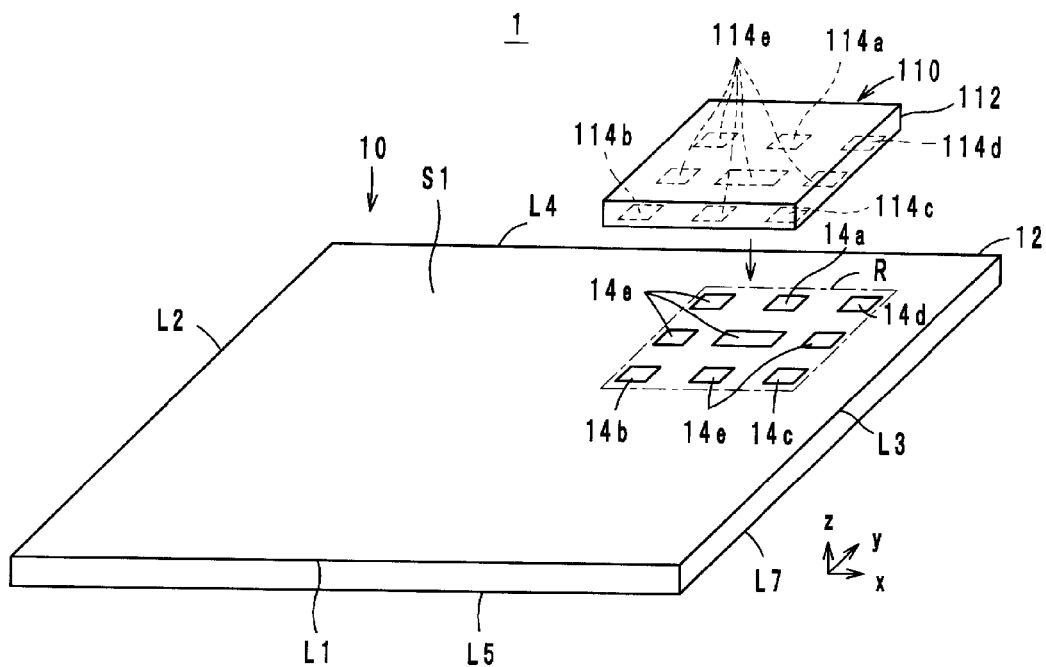
FIGS. 1A and 1B are external perspective views of a circuit module.
Figure 1B:
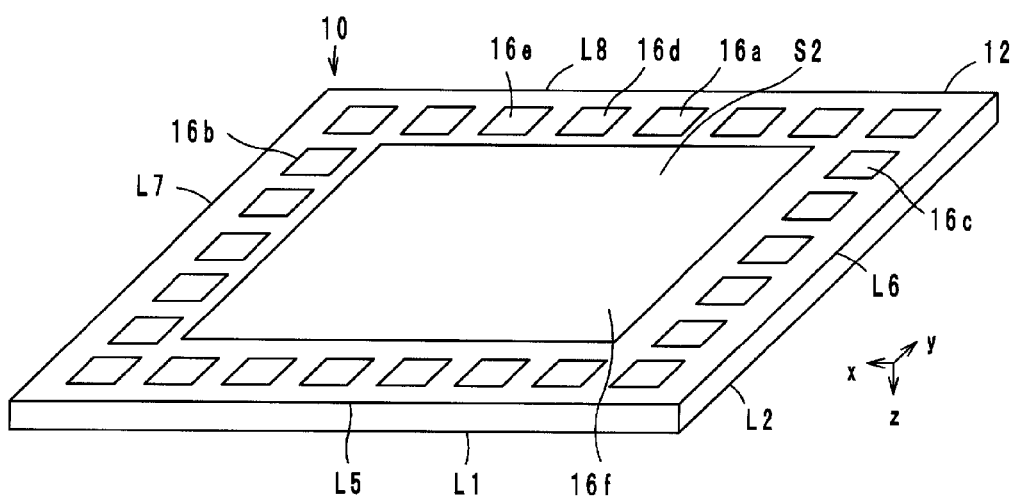
Figure 2:
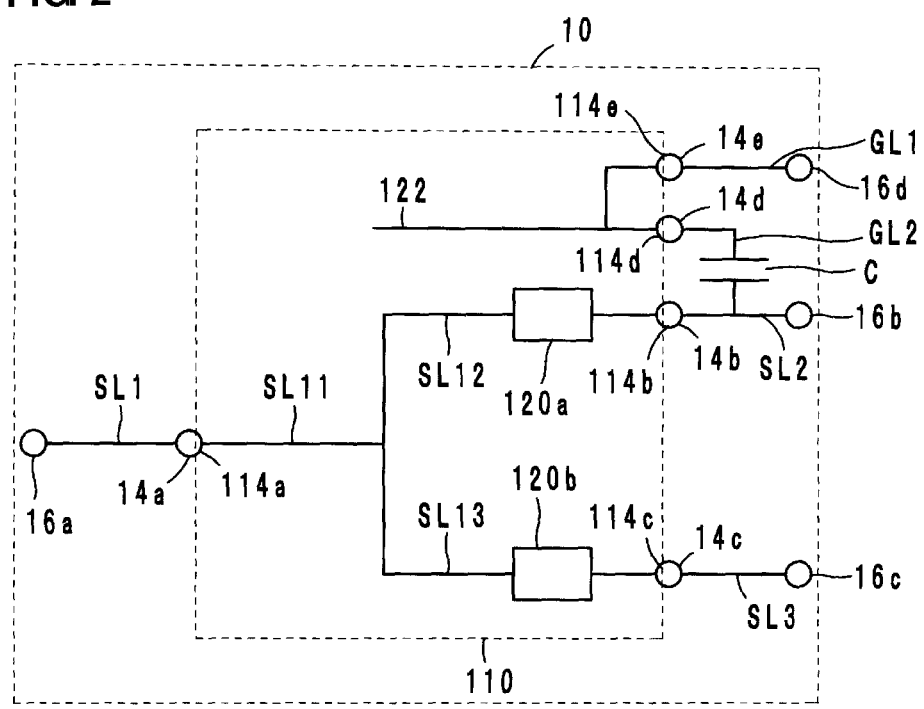
FIG. 2 is a circuit diagram of a circuit module.
Figure 3:
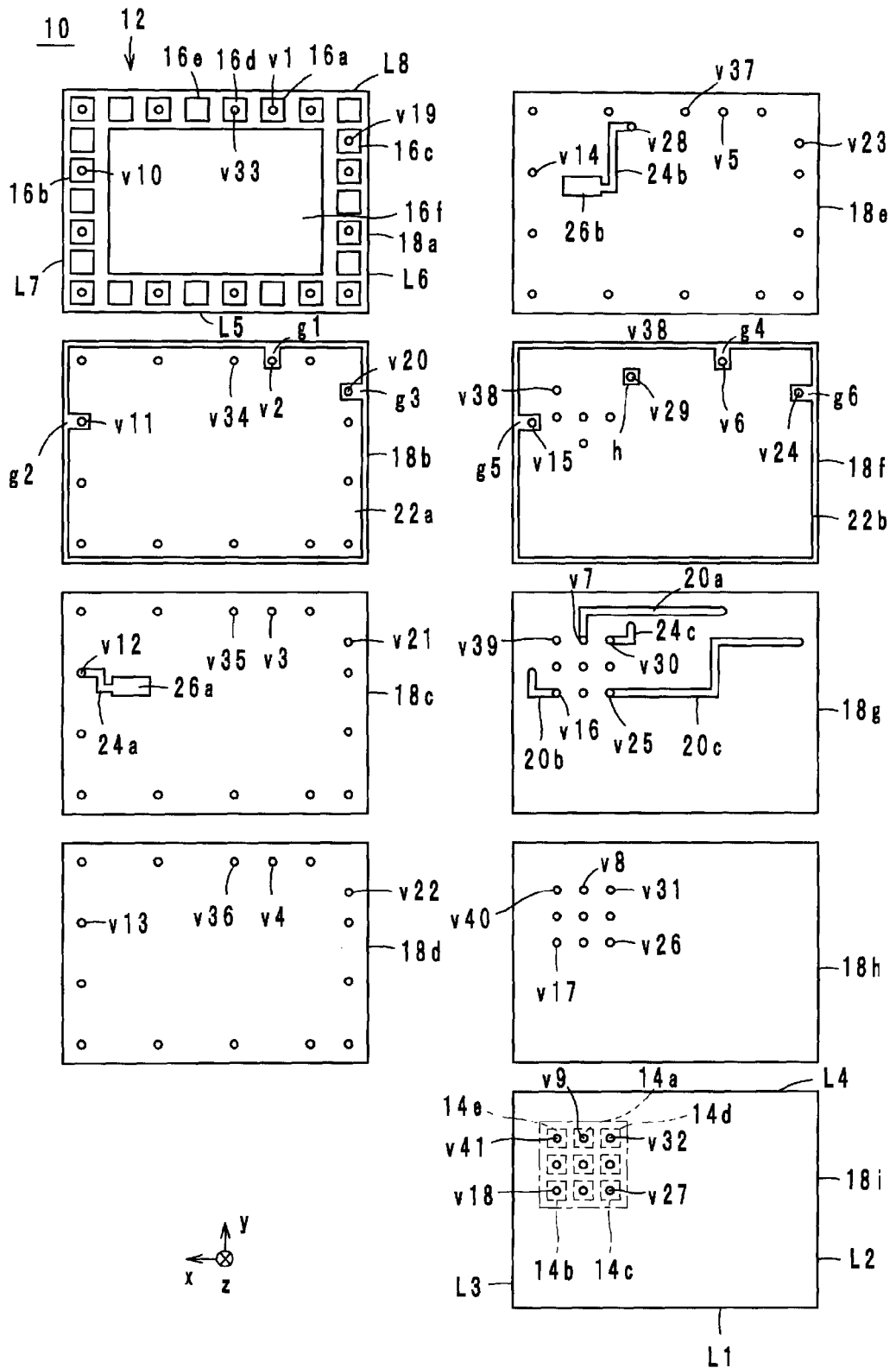
FIG. 3 is an exploded view of a circuit substrate of a circuit module.

First, the configuration of a circuit module is described with reference to the drawings. FIGS. 1A and 1B are external perspective views of a circuit module 1. FIG. 1A is a diagram of the circuit module 1 viewed from above, and FIG. 1B is a diagram of the circuit module 1 viewed from below. FIG. 2 is a circuit diagram of the circuit module 1. FIG. 3 is an exploded view of a circuit substrate 10 of the circuit module 1.

Hereinafter, the stacking direction of the circuit substrate 10 is defined as the z-axis direction. When the circuit substrate 10 is viewed in plan from the z-axis direction, a direction in which the long sides of the circuit substrate 10 extend is defined as the x-axis direction. When the circuit substrate 10 is viewed in plan from the z-axis direction, a direction in which the short sides of the circuit substrate 10 extend is defined as the y-axis direction. The x-axis direction, y-axis direction, and z-axis direction are orthogonal to one another.

The circuit module 1, which is preferably mounted on a mother board of a communication apparatus, such as a cellular phone, for example, is preferably used as a component of a transmitter/receiver circuit of a cellular phone. The circuit module 1 includes the circuit substrate 10 and a duplexer 110, as illustrated in FIGS. 1A and 1B.

First, the configuration of the duplexer 110 is described. Referring to FIGS. 1A, 1B and 2, the duplexer 110 includes a main body 112, external electrodes 114 (114a to 114e), SAW filters 120a and 120b (not illustrated in FIGS. 1A and 1B), and a ground electrode 122 (not illustrated in FIGS. 1A and 1B).

The main body 112 preferably is a multilayer body shaped like a rectangular or substantially rectangular parallelepiped, for example. For example, the main body 112 has a configuration in which, for example, the plurality of SAW filters 120a and 120b, each including a comb electrode provided on, for example, a crystal substrate, are mounted on a base substrate preferably formed by stacking insulator layers made of a ceramic such as alumina and are covered by a resin or a metal cap. Referring to FIGS. 1A and 1B, the external electrodes 114 are provided on a main surface of the main body 112 on the negative z-axis direction side and are preferably arranged in three rows and three columns, for example. The external electrode 114a is provided in the second row and the third column. The external electrode 114b is provided in the first row and the first column. The external electrode 114c is provided in the third row and the first column. The external electrode 114d is provided in the third row and the third column. The external electrodes 114e are five external electrodes 114 other than the external electrodes 114a to 114d.

Referring to FIG. 2, the external electrode 114a is connected to the external electrodes 114b and 114c by signal paths SL11 to SL13. In more detail, the signal path SL11 is connected to the external electrode 114a. The signal paths SL12 and SL13 are connected to the signal path SL11 so as to branch from the signal path SL11 as two branch paths. The external electrodes 114b and 114c are respectively connected to the signal paths SL12 and SL13.

The SAW filters 120a and 120b, which are filters with pass bands of different frequency bands, are housed in the main body 112. In more detail, the SAW filter 120a is provided on the signal path SL12, as illustrated in FIG. 2, and is a filter whose pass band is the frequency band (for example, 2.15 GHz) of a reception signal. The SAW filter 120a outputs to the external electrode 114b only high-frequency signals in the frequency band of a reception signal among high-frequency signals input at the external electrode 114a. The SAW filter 120b is provided on the signal path SL13, as illustrated in FIG. 2, and is a filter whose pass band is the frequency band (for example, 1.95 GHz) of a transmission signal. The SAW filter 120b outputs to the external electrode 114a high-frequency signals in the frequency band of a transmission signal among high-frequency signals input at the external electrode 114c.

The ground electrode 122 is connected to the external electrodes 114d and 114e. The ground electrode 122 is maintained at the ground potential through the external electrodes 114e.

The configuration of the circuit substrate 10 will now be described. Referring to FIGS. 1A, 1B and FIG. 3, the circuit substrate 10 includes a substrate main body 12 and external electrodes 14 (14a to 14e) and 16 (16a to 16f).

The substrate main body 12 preferably is a multilayer body shaped like a rectangular or substantially rectangular parallelepiped, for example, and has a configuration in which insulator layers 18 (18a to 18i) are stacked, as illustrated in FIG. 3. Hereinafter, a main surface of the substrate main body on the positive z-axis direction side is defined as a main surface S1, and a main surface of the substrate main body 12 on the negative z-axis direction side is defined as a main surface S2. Further, a side of the main surface S1 on the negative y-axis direction side is defined as a side L1, a side of the main surface S1 on the negative x-axis direction side is defined as a side L2, a side of the main surface S1 on the positive x-axis direction side is defined as a side L3, and a side of the main surface S1 on the positive y-axis direction side is defined as a side L4. A side of the main surface S2 on the negative y-axis direction side is defined as a side L5, a side of the main surface S2 on the negative x-axis direction side is defined as a side L6, a side of the main surface S2 on the positive x-axis direction side is defined as a side L7, and a side of the main surface S2 on the positive y-axis direction side is defined as a side L8. Further, in the substrate main body 12, a region thereof where the duplexer 110 is mounted when viewed in plan from the z-axis direction (direction of a line normal to the main surface S1) is defined as a mounting region R.

The insulator layers 18 are preferably formed of, for example, a ceramic and are rectangular or substantially rectangular, as illustrated in FIG. 3. The insulator layers 18a to 18i are stacked in such a manner as to be arranged in this order from the negative z-axis direction side to the positive z-axis direction side. Hereinafter, surfaces of the insulator layers 18 on the positive z-axis direction side are called top surfaces, and surfaces of the insulator layers 18 on the negative z-axis direction side are called bottom surfaces. The main surface S1 of the substrate main body 12 is defined by the top surface of the insulator layer 18i, and the main surface S2 of the substrate main body 12 is defined by the bottom surface of the insulator layer 18a.

Referring to FIG. 1A, 1B and FIG. 3, the external electrodes 14 are provided on the main surface S1 (i.e., the top surface of the insulator layer 18i) of the substrate main body 12, and are preferably arranged in three rows and three columns, for example, so as to correspond to the external electrodes 114. The external electrode 14a is provided in the second row and the third column. The external electrode 14b is provided in the first row and the first column. The external electrode 14c is provided in the third row and the first column. The external electrode 14d is provided in the third row and the third column. The external electrodes 14e preferably are five external electrodes 14 other than the external electrodes 14a to 14d. As a result, when the duplexer 110 is mounted on the circuit substrate 10, the external electrodes 14a to 14e are respectively connected to the external electrodes 114a to 114e. Hence, the external electrodes 14a to 14e are arranged within the mounting region R when viewed in plan from the z-axis direction, as illustrated in FIGS. 1A, 1B and FIG. 3.

Referring to FIGS. 1A and 1B, the external electrodes 16 are provided on the main surface S2 (i.e., the bottom surface of the insulator layer 18a) of the substrate main body 12, and are arranged at the center of the main surface S2 and along the periphery of the main surface S2. In more detail, the external electrode 16a is arranged so as to be nearest to the side L8 among the sides L5 to L8, as illustrated in FIG. 3. In the present preferred embodiment, the external electrode 16a is provided near the middle point of the side L8. Referring to FIG. 3, the external electrode 16b is arranged so as to be nearest to the side L7 among the sides L5 to L8. In the present preferred embodiment, the external electrode 16b is arranged near and on the positive y-axis direction side of the middle point of the side L7, among the sides L5 to L8, as illustrated in FIG. 3. Referring to FIG. 3, the external electrode 16c is arranged so as to be nearest to the side L6 among the sides L5 to L8. In the present preferred embodiment, the external electrode 16c is arranged near the positive y-axis direction side end of the side L6.

Referring to FIG. 3, the external electrode 16f is arranged at the center of the main surface S2, and has a larger area than the external electrodes 16a to 16e. Referring to FIG. 3, the external electrodes 16d and 16e are arranged along the periphery of the main surface S2 together with the external electrodes 16a to 16c. Hence, the external electrodes 16a to 16e are not overlapped by the mounting region R when viewed in plan from the z-axis direction. Note that regarding the external electrodes 16d and 16e, only representative ones are denoted by the reference symbols in FIGS. 1A, 1B and FIG. 3 to avoid making the figures complex.

The internal configuration of the circuit substrate 10 will now be described. Referring to FIG. 3, the circuit substrate 10 includes wiring conductors 20 (20a to 20c), 24 (24a, 24b, and 24c), ground conductors 22 (22a and 22b), capacitor conductors 26 (26a and 26b), and via hole conductors v (v1 to v41).

Referring to FIG. 3, the ground conductors 22a and 22b are respectively provided on the bottom surfaces of the insulator layers 18b and 18f and, hence, are housed in the substrate main body 12. The ground conductors 22a and 22b cover substantially the entire bottom surfaces of the insulator layers 18b and 18f and, hence, are overlapped by the mounting region R so as to include the mounting region R when viewed in plan from the z-axis direction. However, the peripheries of the ground conductors 22a and 22b are located slightly within the peripheries of the insulator layers 18b and 18f, and are not in contact with the peripheries of the insulator layers 18b and 18f. Further, cutouts g1 to g6 are provided at the peripheries of the ground conductors 22a and 22b. In addition, a hole h is provided in the ground conductor 22b.

The via hole conductors v1 to v9 and the wiring conductor 20a define a signal path SL1 (refer to FIG. 2) that connects the external electrode 14a to the external electrode 16a. Referring to FIG. 3, the via hole conductors v7 to v9 extend through the insulator layers 18g to 18i in the z-axis direction, and are connected to one another, thereby defining a single via hole conductor. The via hole conductor v9 is connected to the external electrode 14a. Hence, the via hole conductors v7 to v9 are located within the mounting region R when viewed in plan from the z-axis direction.

Referring to FIG. 3, the wiring conductor 20a is a line conductor provided on the bottom surface of the insulator layer 18g. One end of the wiring conductor 20a is connected to the via hole conductor v7. Hence, the one end of the wiring conductor 20a is located within the mounting region R when viewed in plan from the z-axis direction. The other end of the wiring conductor 20a overlaps the external electrode 16a when viewed in plan from the z-axis direction. Hence, the other end of the wiring conductor 20a is located outside of the mounting region R when viewed in plan from the z-axis direction. Further, the other end of the wiring conductor 20a is located nearest to the side L4 among the sides L1 to L4. In this manner, the wiring conductor 20a extends from within the mounting region R to the outside of the mounting region R between the main surface S1 and the ground conductor 22b when viewed in plan from the z-axis direction.

Referring to FIG. 3, the via hole conductors v1 to v6 extend through the insulator layers 18a to 18f, and are connected to one another, thereby defining a single via hole conductor. The via hole conductor v1 is connected to the external electrode 16a. Hence the via hole conductors v1 to v6 are located outside of the mounting region R when viewed in plan from the z-axis direction. Further, the via hole conductor v6 is connected to the other end of the wiring conductor 20a. Hence, the via hole conductors v1 to v6 are located nearest to the side L4 among the sides L1 to L4 when viewed in plan from the z-axis direction. Hence, the via hole conductors v1 to v6 connect the wiring conductor 20a to the external electrode 16a outside of the mounting region R when viewed in plan from the z-axis direction.

Further, the via hole conductors v2 and v6 respectively pass through the cutouts g1 and g4 provided in the ground conductors 22a and 22b. Hence, the via hole conductors v1 to v6 are not connected to the ground conductors 22a and 22b.

Referring to FIG. 2 and FIG. 3, the signal path SL1 configured as described above connects the external electrode 14a to the external electrode 16a. Further, when viewed in plan from the z-axis direction, the signal path SL1 extends from within the mounting region R to the outside of the mounting region R between the main surface S1 and the ground conductor 22b, extends through the outside of the mounting region R, and is connected to the external electrode 16a.

The via hole conductors v10 to v18 and the wiring conductor 20b define a signal path SL2 (refer to FIG. 2) that connects the external electrode 14b to the external electrode 16b. Referring to FIG. 3, the via hole conductors v16 to v18 extend through the insulator layers 18g to 18i in the z-axis direction, and are connected to one another, thereby defining a single via hole conductor. The via hole conductor v18 is connected to the external electrode 14b. Hence, the via hole conductors v16 to v18 are located within the mounting region R when viewed in plan from the z-axis direction.

Referring to FIG. 3, the wiring conductor 20b is a line conductor provided on the bottom surface of the insulator layer 18g. One end of the wiring conductor 20b is connected to the via hole conductor v6. Hence, the one end of the wiring conductor 20b is located within the mounting region R when viewed in plan from the z-axis direction. The other end of the wiring conductor 20b overlaps the external electrode 16b when viewed in plan from the z-axis direction. Hence, the other end of the wiring conductor 20b is located outside of the mounting region R when viewed in plan from the z-axis direction. Further the other end of the wiring conductor 20b is located nearest to the side L3 among the sides L1 to L4 when viewed in plan from the z-axis direction. In this manner, the wiring conductor 20b extends from within the mounting region R to the outside of the mounting region R between the main surface S1 and the ground conductor 22b when viewed in plan from the z-axis direction.

Referring to FIG. 3, the via hole conductors v10 to v15 extend through the insulator layers 18a to 18f in the z-axis direction, and are connected to one another, thereby defining a single via hole conductor. The via hole conductor v10 is connected to the external electrode 16b. Hence, the via hole conductors v10 to v15 are located outside of the mounting region R when viewed in plan from the z-axis direction. Further, the via hole conductor v15 is connected to the other end of the wiring conductor 20b. Hence, the via hole conductors v10 to v15 are provided nearest to the side L3 among the sides L1 to L4 when viewed in plan from the z-axis direction. Hence, the via hole conductors v10 to v15 connect the wiring conductor 20b to the external electrode 16b outside of the mounting region R.

Further, the via hole conductors v11 and v15 respectively pass through the cutouts g2 and g5 provided in the ground conductors 22a and 22b. Hence, the via hole conductors v10 to v15 are not connected to the ground conductors 22a and 22b.

Referring to FIG. 2 and FIG. 3, the signal path SL2 configured as described above connects the external electrode 14b to the external electrode 16b. Further, when viewed in plan from the z-axis direction, the signal path SL2 extends from within the mounting region R to the outside of the mounting region R between the main surface S1 and the ground conductor 22b, extends through the outside of the mounting region R, and is connected to the external electrode 16b.

The via hole conductors v19 to v27 and the wiring conductor 20c define a signal path SL3 (refer to FIG. 2) that connects the external electrode 14c to the external electrode 16c. Referring to FIG. 3, the via hole conductors v25 to v27 extend through the insulator layers 18g to 18i in the z-axis direction, and are connected to one another, thereby defining a single via hole conductor. The via hole conductor v27 is connected to the external electrode 14c. Hence, the via hole conductors v25 to v27 are located within the mounting region R when viewed in plan from the z-axis direction.

Referring to FIG. 3, the wiring conductor 20c is a line conductor provided on the bottom surface of the insulator layer 18g. One end of the wiring conductor 20c is connected to the via hole conductor v25. Hence, the one end of the wiring conductor 20c is located within the mounting region R when viewed in plan from the z-axis direction. The other end of the wiring conductor 20c overlaps the external electrode 16c when viewed in plan from the z-axis direction. Hence, the other end of the wiring conductor 20c is located outside of the mounting region R when viewed in plan from the z-axis direction. Further the other end of the wiring conductor 20c is located nearest to the side L2 among the sides L1 to L4 when viewed in plan from the z-axis direction. In this manner, the wiring conductor 20c extends from within the mounting region R to the outside of the mounting region R between the main surface S1 and the ground conductor 22b when viewed in plan from the z-axis direction.

Referring to FIG. 3, the via hole conductors v19 to v24 extend through the insulator layers 18a to 18f in the z-axis direction, and are connected to one another, thereby defining a single via hole conductor. The via hole conductor v19 is connected to the external electrode 16c. Hence, the via hole conductors v19 to v24 are located outside of the mounting region R when viewed in plan from the z-axis direction. Further, the via hole conductor v24 is connected to the other end of the wiring conductor 20c. Hence, the via hole conductors v19 to v24 are provided nearest to the side L2 among the sides L1 to L4 when viewed in plan from the z-axis direction. Hence, the via hole conductors v19 to v24 connect the wiring conductor 20c to the external electrode 16c outside of the mounting region R.

Further, the via hole conductors v20 and v24 respectively pass through the cutouts g3 and g6 provided in the ground conductors 22ba and 22b. Hence, the via hole conductors v19 to v24 are not connected to the ground conductors 22a and 22b.

Referring to FIG. 2 and FIG. 3, the signal path SL3 configured as described above connects the external electrode 14c to the external electrode 16c. Further, when viewed in plan from the z-axis direction, the signal path SL3 extends from within the mounting region R to the outside of the mounting region R between the main surface S1 and the ground conductor 22b, extends through the outside of the mounting region R, and is connected to the external electrode 16c.

The via hole conductors v33 to v41 and the ground conductors 22a and 22b define a ground path GL1 (refer to FIG. 2) that connects the external electrode 14e to the external electrode 16d. Referring to FIG. 3, the via hole conductor v33 extends through the insulator layer 18a in the z-axis direction, and the via hole conductor v33 connects the external electrode 16d to the ground conductor 22a. The via hole conductor v33 is located outside of the mounting region R when viewed in plan from the z-axis direction. Note that in FIG. 3 only the representative via hole conductor v33 is denoted by the reference symbol to avoid making the figure complex.

Referring to FIG. 3, the via hole conductors v34 to v37 extend through the insulator layers 18b to 18e in the z-axis direction, and are connected to one another, thereby defining a single via hole conductor. The via hole conductors v34 to v37 connect the ground conductor 22a to the ground conductor 22b. Further, the via hole conductors v34 to v37 are located outside of the mounting region R when viewed in plan from the z-axis direction. Note that in FIG. 3 only the representative via hole conductors v34 to v37 are denoted by the reference symbols to avoid making the figure complex.

Referring to FIG. 3, the via hole conductors v38 to v41 extend through the insulator layers 18f to 18i in the z-axis direction, and are connected to one another, thereby defining a single via hole conductor. The via hole conductors v38 to v41 connect the ground conductor 22b to the external electrodes 14e. Further, the via hole conductors v38 to v41 are provided within the mounting region R when viewed in plan from the z-axis direction. Note that in FIG. 3 only the representative via hole conductors v38 to v41 are denoted by the reference symbols to avoid making the figure complex.

The ground path GL1 arranged as described above, connects the external electrode 14e to the external electrode 16d as illustrated in FIG. 2 and FIG. 3. Here, the external electrodes 14e are connected to the external electrodes 114e as illustrated in FIGS. 1A, 1B and FIG. 2. The external electrodes 114e are connected to the ground electrode 122 of the duplexer 110. The external electrode 114d, in addition to the external electrodes 114e, is also connected to the ground electrode 122. The external electrode 114d is connected to the external electrode 14d. Hence, the ground path GL1 connects the external electrode 14e, which is part of the external electrode 14d and the external electrodes 14e electrically connected to the ground electrode 122, to the external electrode 16d.

The circuit module 1 has a configuration that reduces undesirable interference generated between a transmission signal and a reception signal. Hereinafter, this configuration will be described.

The wiring conductor 24a and the capacitor conductor 26a are provided on the bottom surface of the insulator layer 18c. The capacitor conductor 26a preferably is a rectangular or substantially rectangular conductor and defines one electrode of a capacitor C illustrated in FIG. 2. The wiring conductor 24a is a line conductor. One end of the wiring conductor 24a is connected to the via hole conductor v12. The other end of the wiring conductor 24a is connected to the capacitor conductor 26a. As described above, the via hole conductor v12 defines a portion of the signal path SL2. Hence, the one electrode (the capacitor conductor 26a) of the capacitor C is connected to the signal path SL2 as illustrated in FIG. 2.

The wiring conductors 24b and 24c, the capacitor conductor 26b, and the via hole conductors v28 to v32 define a ground path GL2 (refer to FIG. 2), which is connected to the external electrode 14d. Referring to FIG. 3, the via hole conductors v28 and v29 extend through the insulator layers 18e and 18f in the z-axis direction and are connected to one another, thereby defining a single via hole conductor. Note that the ground conductor 22b has the hole h provided therein, and the via hole conductor v29 extends through the hole h. Hence, the via hole conductors v28 and v29 are insulated from the ground conductor 22b.

Referring to FIG. 3, the wiring conductor 24c is a line conductor provided on the bottom surface of the insulator layer 18g. One end of the wiring conductor 24c is connected to the via hole conductor v29. The other end of the wiring conductor 24c is overlapped by the external electrode 14d when viewed in plan from the z-axis direction. The via hole conductors v30 to v32 extend through the insulator layers 18g and 18i and are connected to one another, thereby defining a single via hole conductor. The via hole conductor v30 is connected to the other end of the wiring conductor 24c. The via hole conductor v32 is connected to the external electrode 14d.

The capacitor conductor 26b preferably is a rectangular or substantially rectangular conductor and defines the other electrode of the capacitor C illustrated in FIG. 2. Hence the capacitor conductor 26b overlaps the capacitor conductor 26a when viewed in plan from the z-axis direction. The wiring conductor 24b is a line conductor. One end of the wiring conductor 24b is connected to the via hole conductor v28. The other end of the wiring conductor 24b is connected to the capacitor conductor 26b.

Referring to FIG. 2 and FIG. 3, the ground path GL2 configured as described above is connected to the external electrode 14d, which is not connected to the external electrodes 16, and is capacitively coupled to the signal path SL2.

In the circuit module 1 configured as described above, a reception signal is input at the external electrode 16a. The reception signal passes through the SAW filter 120a, and is output to the outside of the circuit module 1 through the external electrode 16b. Here, the SAW filter 120b has a pass band that is the frequency band of a transmission signal and does not have a pass band that is the frequency band of a reception signal. Hence, the reception signal input at the external electrode 16a cannot pass through the SAW filter 120b and, hence, is not output from the external electrode 16c.

A transmission signal is input at the external electrode 16c. The transmission signal passes through the SAW filter 120b and is output to the outside of the circuit module 1 through the external electrode 16a. Here, the SAW filter 120a has a pass band that is the frequency band of a reception signal and does not have a pass band that is the frequency band of a transmission signal. Hence, the transmission signal which has passed the SAW filter 120b cannot pass through the SAW filter 120a and, hence, is not output from the external electrode 16b.

The circuit module 1 described above significantly reduces and prevents undesirable interference generated between a transmission signal and a reception signal. In more detail, as illustrated in FIG. 2 and FIG. 3, the ground path GL2 connected to the ground electrode 122 of the duplexer 110 is capacitively coupled through the capacitor C to the signal path SL2 over which a reception signal is transmitted. As a result, undesirable interference generated between a transmission signal and a reception signal is significantly reduced and prevented. The inventor of the present invention performed computer simulation described below to confirm the advantageous effects of the circuit substrate 10 according to a preferred embodiment of the present invention.

Figure 4:
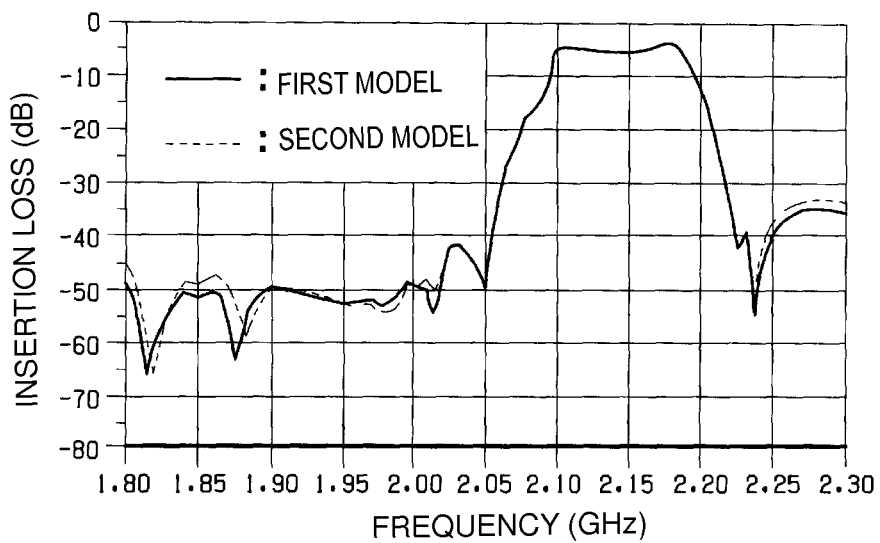
FIG. 4 is a graph illustrating pass band characteristics for a reception signal.
Figure 5:
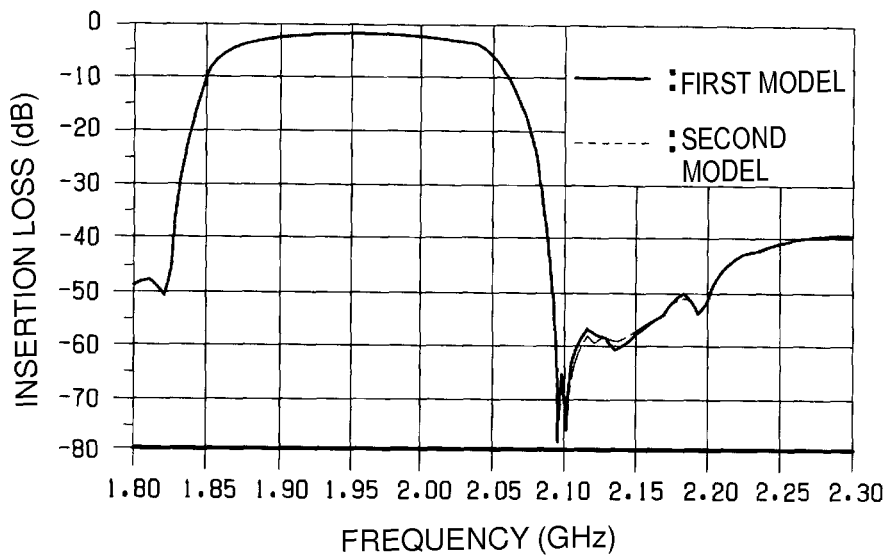
FIG. 5 is a graph illustrating pass band characteristics for a transmission signal.
Figure 6:
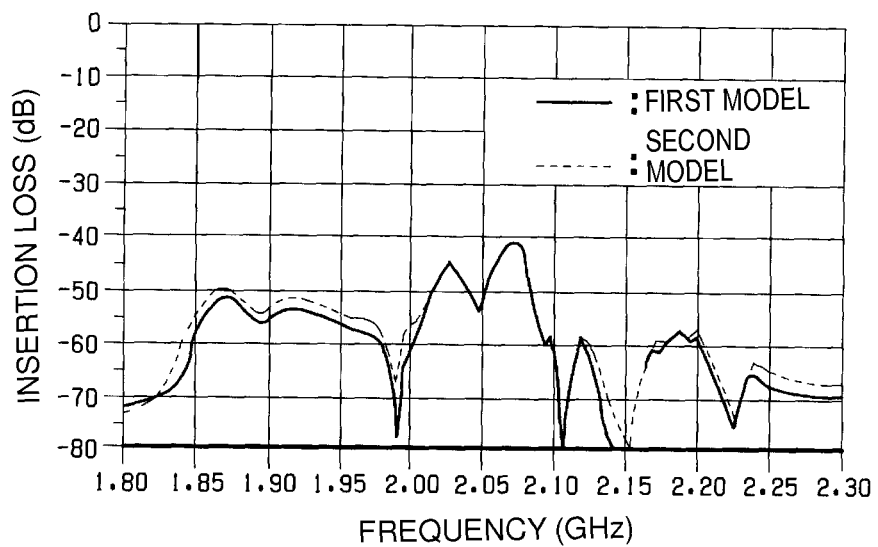
FIG. 6 is a graph illustrating isolation characteristics.
Figure 7:
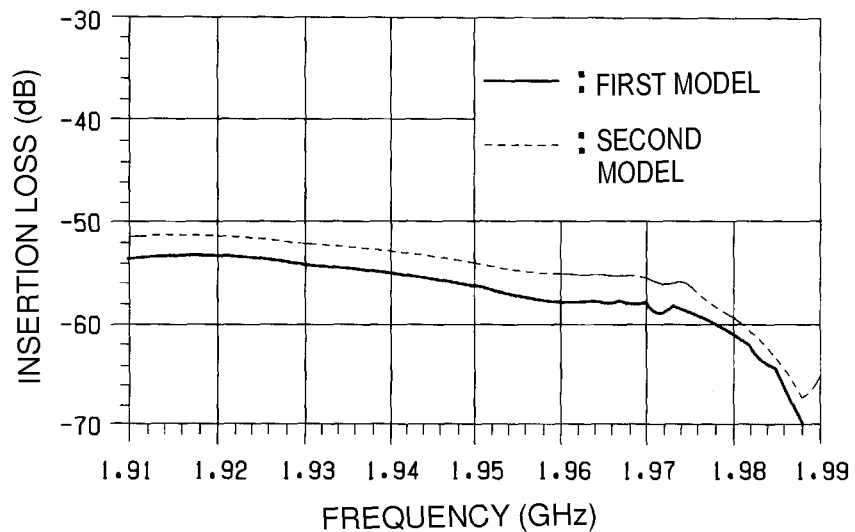
FIG. 7 is a magnified view of the graph illustrated in FIG. 6.

First, a model of the circuit module 1 was created as a first model. Here, the capacitance of the capacitor C was set to 0.97 pF, for example. Further, a model of the circuit module 1 without the capacitor C was created as a second model. Then, by inputting a transmission signal and a reception signal to the first model and the second model, pass band characteristics (pass band characteristics for a reception signal) between the external electrodes 16a and 16b, pass band characteristics (pass band characteristics for a transmission signal) between the external electrodes 16a and 16c, and pass band characteristics (isolation characteristics) between the external electrodes 16b and 16c were determined. FIG. 4 is a graph illustrating the pass band characteristics for a reception signal. FIG. 5 is a graph illustrating the pass band characteristics for a transmission signal. FIG. 6 is a graph illustrating the isolation characteristics. FIG. 7 is a magnified view of the graph illustrated in FIG. 6. In FIG. 4 to FIG. 7, the vertical axis represents insertion loss, and the horizontal axis represents frequency.

FIG. 4 and FIG. 5 show that the pass band for a transmission signal is different from the pass band for a reception signal. In other words, it can be seen that the circuit module 1 functions as a duplexer. Further, as can be seen from the graphs of the isolation characteristics illustrated in FIG. 6 and FIG. 7, the insertion loss in the first model is larger than that in the second model. This shows that the first model achieves better isolation characteristics between the external electrodes 16b and 16c than the second model. Hence, it can be seen that undesirable interference generated between a transmission signal and a reception signal can be significantly reduced in the first model more than in the second model.

Further, the circuit substrate 10 can significantly reduce undesirable interference generated between a transmission signal and a reception signal also due to the following reason. Specifically, in the circuit substrate 10, the ground conductors 22a and 22b are overlapped by the mounting region R so as to include the mounting region R when viewed in plan from the z-axis direction, as illustrated in FIG. 3. Further, when viewed in plan from the z-axis direction, the signal paths SL1 to SL3 extend to the outside of the mounting region R between the main surface S1 and the ground conductor 22b, extend through the outside of the mounting region R, and are connected to the external electrodes 16a and 16c. Hence, when viewed in plan from the z-axis direction, the ground conductors 22a and 22b exist between any two of the signal path SL1, the signal path SL2, and the signal path SL3. The ground conductors 22a and 22b are maintained at the ground potential. As a result, undesirable interference generated between a transmission signal and a reception signal in the signal paths SL1 to SL3 can be reduced.

Further, undesirable interference generated between a transmission signal and a reception signal can be reduced in the circuit module 1 also due to the following reason. In detail, in the circuit module 1, the via hole conductors v1 to v6 of the signal path SL1 are located nearest to the side L4 among the sides L1 to L4, the via hole conductors v10 to v15 of the signal path SL2 are located nearest to the side L3 among the sides L1 to L4, and the via hole conductors v19 to v24 of the signal path SL3 are located nearest to the side L2 among the sides L1 to L4. Hence, the via hole conductors v1 to v6, the via hole conductors v10 to v15, and the via hole conductors v19 to v24 are close to different sides. In other words, the via hole conductors v1 to v6, the via hole conductors v10 to v15, and the via hole conductors v19 to v24 are arranged so as to be spaced apart from one another. As a result, undesirable interference generated between a transmission signal and a reception signal can be significantly reduced and prevented reduced in the signal paths SL1 to SL3.

Further, referring to FIG. 3, the via hole conductors v2, v11, and v20, which respectively extend through the insides of the cutouts g1 to g3 of the ground conductor 22a, are surrounded by the ground conductor 22a. The ground conductor 22a is maintained at the ground potential. Hence, undesirable interference generated between a transmission signal and a reception signal can be significantly reduced and prevented in the signal paths SL1 to SL3.

The circuit module 1 configured as described above is not limited to the preferred embodiment described above. Hence, the circuit module 1 can be modified within the scope of the present invention.

Although the signal path SL2 preferably is capacitively coupled to the ground path GL2 in the circuit module 1 as described above, the signal path SL1 may be capacitively coupled to the ground path GL2, for example.

Although the signal path SL2 preferably is capacitively coupled to the ground path GL2 in the circuit module 1 as described above, these elements need only be electromagnetically coupled to each other. Hence, the signal path SL2 may be magnetically coupled to the ground path GL2, for example.

In the circuit module 1, the signal path SL2 may be connected to the ground path GL2 through a phase unit instead of being electromagnetically coupled to the ground path GL2. A phase unit has a configuration in which a wiring electrode is provided instead of the capacitor C illustrated in FIG. 2 and the phase is changed by adjusting the electrode length of the wiring electrode. The phase of the phase unit is, for example, 71.3° or 74.8°. Further, a balanced filter including a balanced-unbalanced conversion function may be used as the reception filter.

Note that the ground conductors 22a and 22b need not be provided.

Note that one end of the ground electrode 122 is connected to only the external electrodes 114e and 114d and the other end of the ground electrode 122 is not connected to any component, as illustrated in FIG. 2. However, the other end of the ground electrode 122 may be connected to a component within the duplexer 110 or, for example, connected to the ground terminal of the SAW filter 120a or 120b.

Although the single ground electrode 122 preferably is provided for the external electrodes 114e and 114d, the ground electrode 122 may be provided for each of the external electrodes 114e and 114d, for example. Further, the ground electrode 122 need only be a conductor that is maintained at the ground potential, and may be a line conductor defining the wiring or a planar conductor with a comparatively large area.

Preferred embodiments of the present invention are useful in a circuit substrate and, in particular, are advantageous in that undesirable interference generated among a plurality of types of signal is significantly reduced and prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit module comprising:
   a duplexer; and
   a circuit substrate on which the duplexer is mounted; wherein
   the duplexer includes:
      a duplexer main body;
      first, second and third external electrodes and a plurality of duplexer ground external electrodes provided on the duplexer main body;
      a first filter that outputs a signal input at the first external electrode to the second external electrode;
      a second filter that outputs a signal input at the third external electrode to the first external electrode;
      a ground conductor that is connected to the duplexer ground external electrodes and that is maintained at a ground potential; and
   the circuit substrate includes:
      a substrate main body;
      fourth, fifth and sixth external electrodes and a plurality of substrate top surface ground external electrodes that are provided on the substrate main body and that are respectively connected to the first, second and third external electrodes and the plurality of the duplexer ground external electrodes;
      seventh, eighth and ninth external electrodes and a substrate bottom surface ground external electrode provided on the substrate main body;
      a first signal path that connects the fourth external electrode to the seventh external electrode, a second signal path that connects the fifth external electrode to the eighth external electrode, and a third signal path that connects the sixth external electrode to the ninth external electrode;
      a first ground path that connects a portion of the plurality of the substrate top surface ground external electrodes to the substrate bottom surface ground external electrode; and
      a second ground path that is connected to the substrate top surface ground external electrode which is not connected to the substrate bottom surface ground external electrode and that is electromagnetically coupled to the second signal path or the third signal path.

2. The circuit module according to claim 1, wherein the second ground path is capacitively coupled to the second signal path or the third signal path.

3. The circuit module according to claim 1, wherein the second ground path is magnetically coupled to the second signal path or the third signal path.

4. The circuit module according to claim 1, wherein the duplexer includes a plurality of surface acoustic wave filters.

5. The circuit module according to claim 4, wherein the surface acoustic wave filters have different frequency bands.

6. The circuit module according to claim 1, wherein the circuit module is a transmitted/receiver circuit element of a communication apparatus.

7. The circuit module according to claim 1, wherein the duplexer main body is a rectangular or substantially rectangular multilayer body.

8. The circuit module according to claim 1, wherein substrate main body is a rectangular or substantially rectangular multilayer body.

9. The circuit module according to claim 1, wherein the first, second, third, fourth, fifth, sixth, seventh, eighth, and ninth external electrodes are arranged in three rows and three columns.

10. A communication apparatus including the circuit module according to claim 1.

11. A circuit module comprising:
- a duplexer; and
- a circuit substrate on which the duplexer is mounted; wherein the duplexer includes:
- a duplexer main body;
- first, second and third external electrodes and a plurality of duplexer ground external electrodes provided on the duplexer main body;
- a first filter that outputs a signal input at the first external electrode to the second external electrode;
- a second filter that outputs a signal input at the third external electrode to the first external electrode;
- a ground conductor that is connected to the duplexer ground external electrodes and that is maintained at a ground potential; and the circuit substrate includes:
- a substrate main body;
- fourth, fifth and sixth external electrodes and a plurality of substrate top surface ground external electrodes that are provided on the substrate main body and that are respectively connected to the first to third external electrodes and the plurality of the duplexer ground external electrodes;
- seventh, eighth, and ninth external electrodes and a substrate bottom surface ground external electrode provided on the substrate main body;
- a first signal path that connects the fourth external electrode to the seventh external electrode, a second signal path that connects the fifth external electrode to the eighth external electrode, and a third signal path that connects the sixth external electrode to the ninth external electrode;
- a first ground path that connects a portion of the plurality of the substrate top surface ground external electrodes to the substrate bottom surface ground external electrode; and
- a second ground path that is connected to the substrate top surface ground external electrode which is not connected to the substrate bottom surface ground external electrode and that is coupled to the second signal path or the third signal path through a phase unit.

12. The circuit module according to claim 11, wherein the second ground path is capacitively coupled to the second signal path or the third signal path.

13. The circuit module according to claim 11, wherein the second ground path is magnetically coupled to the second signal path or the third signal path.

14. The circuit module according to claim 11, wherein the duplexer includes a plurality of surface acoustic wave filters.

15. The circuit module according to claim 14, wherein the surface acoustic wave filters have different frequency bands.

16. The circuit module according to claim 11, wherein the circuit module is a transmitted/receiver circuit element of a communication apparatus.

17. The circuit module according to claim 11, wherein the duplexer main body is a rectangular or substantially rectangular multilayer body.

18. The circuit module according to claim 11, wherein substrate main body is a rectangular or substantially rectangular multilayer body.

19. The circuit module according to claim 11, wherein the first, second, third, fourth, fifth, sixth, seventh, eighth, and ninth external electrodes are arranged in three rows and three columns.

20. A communication apparatus including the circuit module according to claim 11.

* * * * *